(12) United States Patent
Swanson et al.

(10) Patent No.: US 9,239,258 B1
(45) Date of Patent: Jan. 19, 2016

(54) HIGH EFFICIENCY PHOTOELECTRIC CELL

(71) Applicants: Paul David Swanson, Santee, CA (US); Richard L. Waters, San Diego, CA (US)

(72) Inventors: Paul David Swanson, Santee, CA (US); Richard L. Waters, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 517 days.

(21) Appl. No.: 13/631,340

(22) Filed: Sep. 28, 2012

(51) Int. Cl.
*G01J 1/00* (2006.01)
(52) U.S. Cl.
CPC .......................................... *G01J 1/00* (2013.01)
(58) Field of Classification Search
CPC .......................................................... G01J 1/00
USPC ...................................................... 250/336.1
See application file for complete search history.

(56) References Cited

U.S. PATENT DOCUMENTS

| | | | |
|---|---|---|---|
| 2,919,364 A | 12/1959 | Sprick et al. | |
| 3,299,306 A * | 1/1967 | Kapany | 313/524 |
| 4,178,524 A | 12/1979 | Ritter | |
| 4,243,751 A * | 1/1981 | Swartz | 435/168 |
| 5,063,327 A * | 11/1991 | Brodie et al. | 313/482 |
| 5,989,743 A * | 11/1999 | Yamashita | 429/129 |
| 6,190,426 B1 * | 2/2001 | Thibault et al. | 29/623.2 |
| 7,242,007 B2 * | 7/2007 | Cole | 250/374 |
| 8,115,093 B2 | 2/2012 | Gui et al. | |
| 2003/0221957 A1 * | 12/2003 | Herchen et al. | 204/280 |
| 2004/0238881 A1 * | 12/2004 | Ozawa | 257/316 |
| 2008/0283764 A1 * | 11/2008 | Kerwin | 250/389 |
| 2009/0230841 A1 * | 9/2009 | Boerner | 313/504 |
| 2013/0070385 A1 * | 3/2013 | Harada et al. | 361/301.4 |
| 2013/0182370 A1 * | 7/2013 | Ogawa et al. | 361/301.4 |

\* cited by examiner

*Primary Examiner* — David Porta
*Assistant Examiner* — Gisselle Gutierrez
(74) *Attorney, Agent, or Firm* — SPAWAR Systems Center Pacific; Kyle Eppele; J. Eric Anderson

(57) ABSTRACT

A photoelectric cell comprising: a cathode layer configured to eject electrons in response to receiving photons from a light source; a substantially-photon-transparent anode configured to receive the ejected electrons; first and second, substantially-photon-transparent, dielectric layers, wherein the first dielectric layer is disposed between the cathode layer and the anode layer and wherein the anode layer is disposed between the first and second dielectric layers such that the cathode layer, the first dielectric layer, the anode layer, and the second dielectric layer form a layered stack; and wherein at least a first portion of the layered stack overlaps a second portion of the layered stack.

20 Claims, 4 Drawing Sheets

HIGH EFFICIENCY PHOTOELECTRIC CELL

FEDERALLY-SPONSORED RESEARCH AND DEVELOPMENT

This invention is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 101443.

BACKGROUND OF THE INVENTION

Semiconductor based photovoltaic cells are not efficient in harvesting power from high energy photons since the resulting potential is limited to the band gap between the valence and conduction band of the semiconductor. No semiconductor band gaps exist that match the energy of x-ray and gamma ray photons. A photoelectric cell, on the other hand, uses physical displacement instead of band gap displacement to separate the photon-excited electron from a cathode to an anode. However, photoelectric cells are not very efficient, since the majority of electrons accelerated by the absorption of photons do not leave the cathode and instead just increase the lattice temperature of the cathode. In other words, instead of being ejected out of the cathode in the direction of the anode, the accelerated electron is more likely to go further into the cathode, generating heat in the process. A need exists for a more efficient photoelectric cell.

SUMMARY

Disclosed herein is a photoelectric cell comprising: a cathode layer configured to eject electrons in response to receiving photons from a light source; a substantially-photon-transparent anode configured to receive the ejected electrons; first and second, substantially-photon-transparent, dielectric layers, wherein the first dielectric layer is disposed between the cathode layer and the anode layer and wherein the anode layer is disposed between the first and second dielectric layers such that the cathode layer, the first dielectric layer, the anode layer, and the second dielectric layer form a layered stack; and wherein at least a first portion of the layered stack overlaps a second portion of the layered stack.

Another embodiment of the photoelectric cell is non-photovoltaic and comprises: a layered stack capable of being wrapped around a photon-producing light source, wherein the layered stack comprises the following layers bonded together in the following order, starting with the layer closest to the light source: a cathode layer; a first, substantially-photon-transparent, dielectric layer; a substantially-photon-transparent anode; and a second, substantially-photon-transparent, dielectric layer.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

Figure 1A:
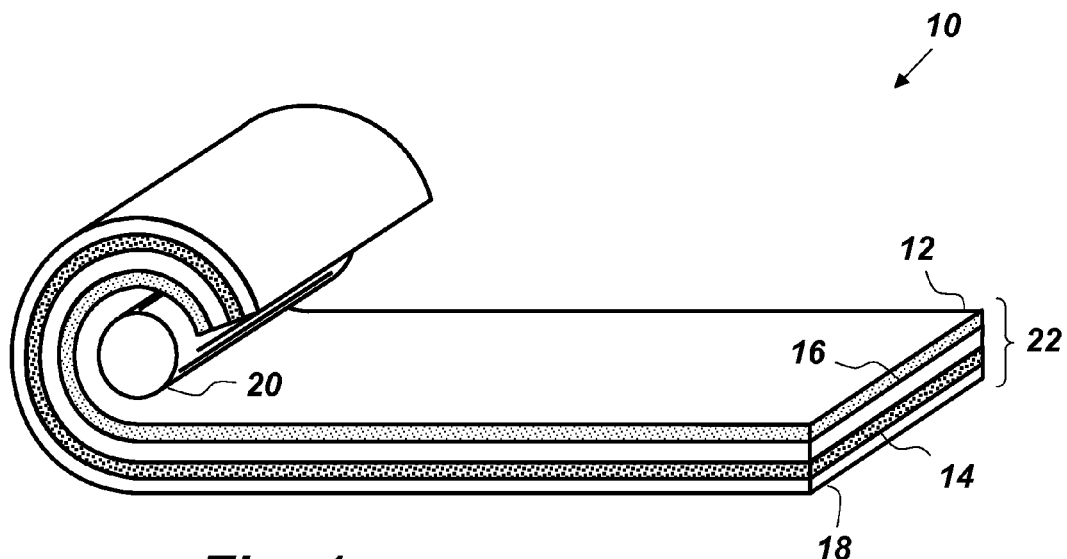
FIGS. 1a-1b are perspective views of an embodiment of a photoelectric cell.
Figure 1B:
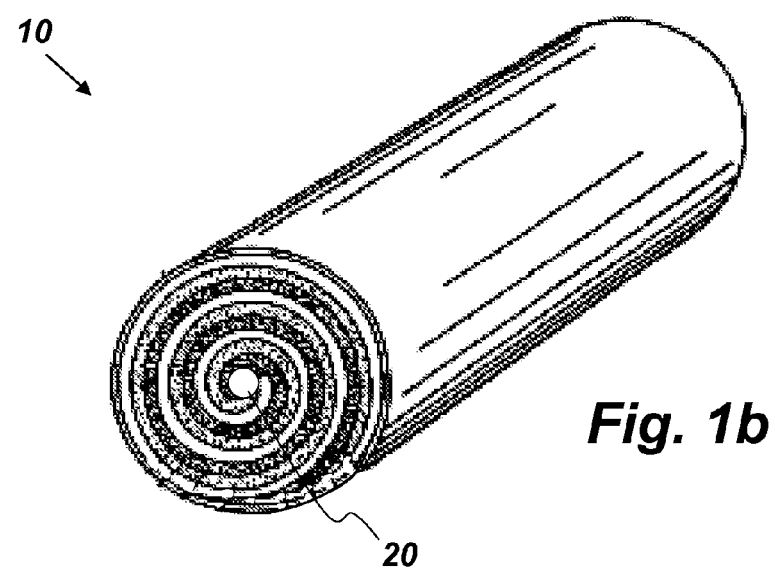

FIGS. 1a-1b are perspective views of an embodiment of a photoelectric cell 10, which comprises a cathode layer 12, an anode layer 14, and first and second dielectric layers 16 and 18 respectively. The cathode layer 12 is configured to eject electrons in response to receiving photons from a light source 20. The anode layer 14 is substantially-photon-transparent and is configured to receive the ejected electrons. The first and second dielectric layers 16 and 18 are also substantially-photon-transparent. The first dielectric layer 16 is disposed between the cathode layer 12 and the anode layer 14. The anode layer 14 is disposed between the first and second dielectric layers 16 and 18 such that the cathode layer 12, the first dielectric layer 16, the anode layer 14, and the second dielectric layer 18 form a layered stack 22. The photocell 10 is a device based on the photoelectric effect which describes how photons can kinetically eject electrons from the surface of matter. The photoelectric cell 10 uses the photoelectric effect to transfer electrons from a photon illuminated cathode layer 12 to an anode layer 14, producing an electrical potential.

In the photoelectric cell 10, at least a first portion of the layered stack 22 overlaps a second portion of the layered stack 22 such that a straight line drawn through a cross section of the photocell 10 must be able to intersect a given layer of the layered stack 22 at least twice. For example, the layered stack 22 may be rolled or folded on itself. FIGS. 1a-1b show an embodiment of the photoelectric cell 10 where the layered stack 10 is wrapped around the light source 20 to form a substantially cylindrical roll. Having the layered stack 22 wrapped around the light source 20 allows the cathode layer 12 to collect photons emitted in all directions from the light source 20. Although the cathode layer 12 is depicted in FIG. 1a as being the closest layer to the light source 20, it is to be understood that the photocell 10 is not limited to this embodiment. The order of the layers in the layered stack 22 may be in any desired order provided that the cathode layer 12 and the anode layer 14 are separated by either of the dielectric layers 16 or 18. Furthermore, the layered stack 22 may overlap itself any desired number of times provided that at least one section of the layered stack 22 overlaps another section of the layered stack 22. For example, the layered stack may have any desired number of folds or wraps or combination thereof such that there are sufficient layers to convert most all the photons into electrical potential.

The cathode layer 12 may be made of any substance (solid, liquid, or gaseous) that releases electrons when exposed to a light source according to the photoelectric effect. Suitable example substances for the cathode layer 12 include, but are not limited to, tungsten, tantalum, and lead. The composition, structure, and thickness of the cathode layer 12 may be tailored to the anticipated photon-energy to which the photocell 10 will be exposed. For example, in an embodiment of the photocell 10 where the light source 20 produces gamma ray photons, the cathode layer 12 may be a thin layer of tungsten having a thickness of less than a micron. Due to the overlapping nature of the photoelectric cell 10, if the cathode layer 12 is sufficiently thin, the photon-excited electrons will be ejected to either a section of the anode layer 14 in front of or to a section of the anode layer 14 behind the cathode layer 12, thus substantially minimizing any heating of the cathode layer 12 by photon-excited electrons.

The photoelectric cell 10 may be designed to reduce the photon-excited electrons that do not leave the cathode layer 12 by making the cathode layer 12 very thin such that the ejection of electrons from the cathode layer 12 can occur from either side of the cathode layer 12. This reduction of photon-excited electrons that get trapped in the cathode layer 12 comes at the expense of the number of photons absorbed in a single pass through the cathode layer 12. This is mitigated in the photocell 10 by the substantially-photon-transparent nature of the anode layer 14 and the separating dielectric layers 16 and 18. The substantially-photon-transparent nature of the anode layer 14 and the dielectric layers 16 and 18 allows those layers to be substantially transparent to the incident photons such that photons that pass through the cathode layer 12 without interaction on the first pass will have additional opportunities to interact with the cathode layer 12, depending on the number of folds and/or wraps of the layered stack 22. The high resistance of a thin cathode layer 12 may be offset by thin wire traces built into the cathode layer 12. Although FIGS. 1a-1b depict the cathode layer 12 as a conductive planar sheet, it is to be understood that the structure of the cathode layer 12 is not limited to that embodiment, but may be any desired structure, including, but not limited to, any desired electrode mesh, grid, pattern, or matrix, or transparent conductor in ohmic contact with the cathode.

The anode layer 14 may be made of any material that is capable of receiving the photon-excited electrons and that is substantially transparent to the photon. Suitable example substances for the anode layer 14 include, but are not limited to, indium tin oxide (ITO) for visible light, beryllium for x-rays, and aluminum for gamma rays. The composition, structure, and thickness of the anode layer 14 may be tailored to the anticipated photon-energy to which the photocell 10 will be exposed. For example, in an embodiment of the photocell 10 where the light source 20 produces gamma ray photons, the anode layer 14 may be a layer of aluminum having a thickness of approximately 25 microns. Although FIGS. 1a-1b depict the anode layer 14 as a conductive planar sheet, it is to be understood that the structure of the anode layer 14 is not limited to conductive planar sheets, but may be any desired structure, including, but not limited to, any desired electrode mesh, grid, pattern, or matrix.

The dielectric layers 16 and 18 may be made of any material, or combination of materials, that is relatively transparent to the photon produced by the light source 20. Suitable examples of the dielectric layers 16 and 18 include, but are not limited to, air, empty space, electrically insulating mesh barriers, non-conductive aerogels, fabric, dielectric screens and polyimides. The composition, structure, and thickness of the dielectric layers 16 and 18 may be tailored to the anticipated photon-energy to which the photocell 10 will be exposed. For example, in an embodiment of the photocell 10 where the light source 20 produces gamma ray photons, the dielectric layers 16 and 18 may be layers of a polyimide film, each having a thickness of approximately 10 microns. A suitable example of a polyimide film is Kapton® developed by DuPont. The breakdown voltage of the designed dielectric layers 16 and 18 should be greater than the maximum electrical potential, either defined by the photon energy or by an electronic load on across the cathode layer 12 and the anode layer 14.

The light source 20 may be any desired photon-producing source. Suitable examples of the light source 20 include, but are not limited to, an x-ray emitter, a gamma ray emitter, an ultra violet source, and a visible light source. The light source 20 may be wrapped within the photocell 10 or may be disposed outside the photocell 10. In the embodiment of the photocell 10 depicted in FIGS. 1a-1b, the light source 20 is a lossy light pipe extending down the center of the substantially cylindrical roll.

Figure 2:
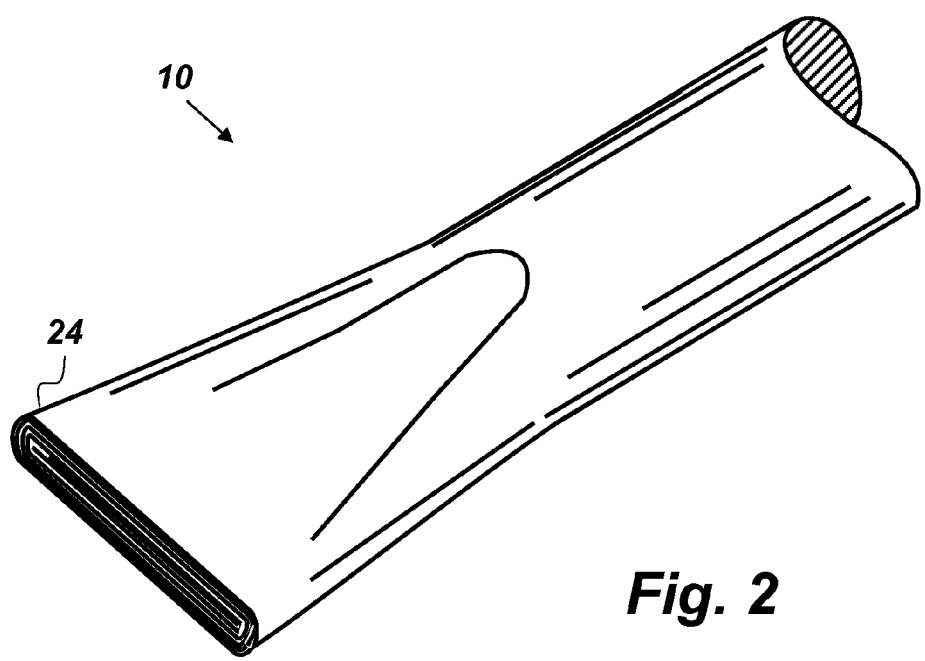
FIG. 2 is a partial perspective view of an embodiment of the photoelectric cell showing a crimped end.

FIG. 2 is a partial perspective view of an embodiment of the photoelectric cell 10. In this embodiment, an end 24 of the photoelectric cell 10 is crimped. One or both ends 24 of the layered stack 22 by be crimped in order to capture photons being emitted in all directions and to reduce the amount of photons that escape out the ends 24.

Figure 3:
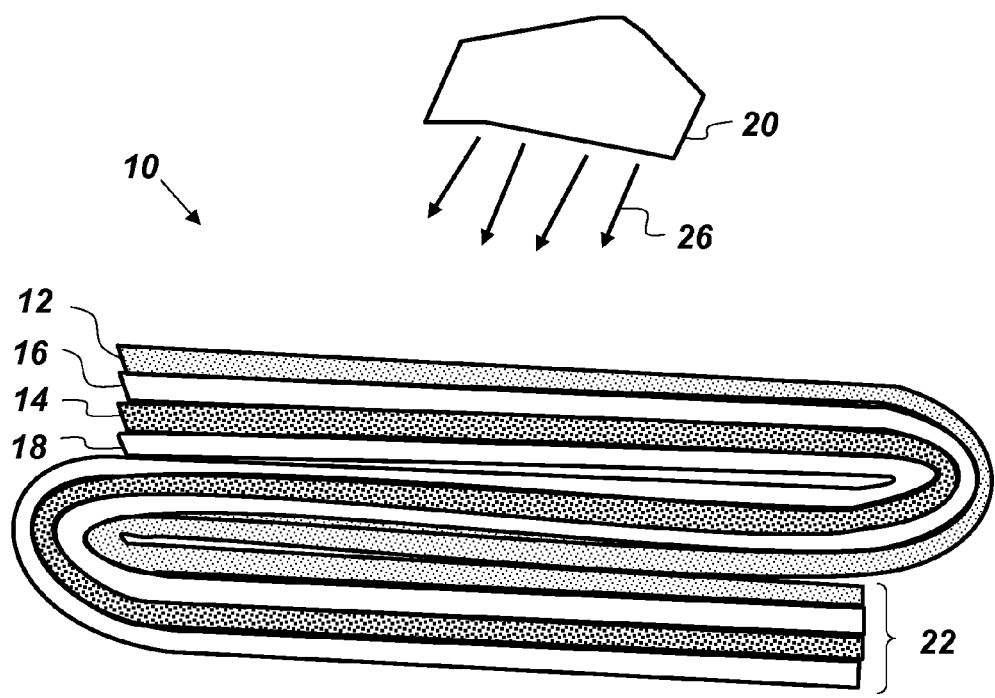
FIG. 3 is a cross-sectional view of a folded embodiment of the photoelectric cell.

FIG. 3 is a cross-sectional view of a folded embodiment of the photoelectric cell 10. FIG. 3 shows the light source 20 as being outside the photoelectric cell 10. In this embodiment, photons 26 generated by light source 20 first encounter the cathode layer 12 where some photons will cause some photon-excited electrons to be ejected from the cathode layer 12 and other photons will pass through the cathode layer 12 without exciting any electrons. Those photons that pass through the cathode layer 12 without exciting any electrons then pass through the following layers before encountering the cathode layer 12 again: dielectric layer 16, anode layer 14, dielectric layer 18, dielectric layer 18, anode layer 14, and dielectric layer 16.

Figure 4:
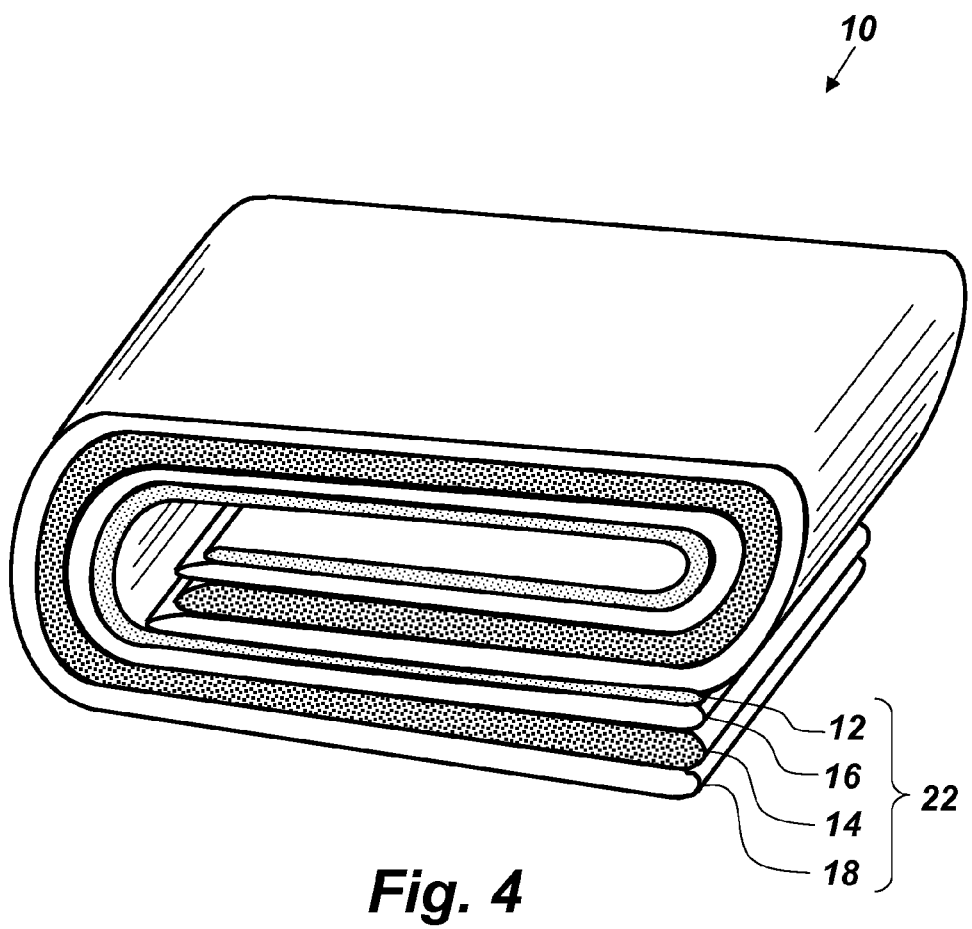
FIG. 4 is a perspective view of another folded embodiment of the photoelectric cell.

FIG. 4 is a perspective view of another folded embodiment of the photoelectric cell 10. FIG. 4 shows an alternative form of wrapping and folding of the layered stack 22. While not shown in this figure, the light source 20 may be positioned within or outside the photoelectric cell 10.

From the above description of the photoelectric cell 10, it is manifest that various techniques may be used for implementing the concepts of the photoelectric cell 10 without departing from its scope. The described embodiments are to be considered in all respects as illustrative and not restrictive. It should also be understood that the photoelectric cell 10 is not limited to the particular embodiments described herein, but is capable of many embodiments without departing from the scope of the claims.

We claim:

1. A photoelectric cell comprising:
   a cathode layer configured to eject electrons in response to receiving photons from a light source;
   a substantially-photon-transparent anode configured to receive the ejected electrons;
   first and second, substantially-photon-transparent, dielectric layers, wherein the first dielectric layer is disposed between the cathode layer and the anode layer and wherein the anode layer is disposed between the first and second dielectric layers such that the cathode layer, the first dielectric layer, the anode layer, and the second dielectric layer form a layered stack; and
   wherein at least a first portion of the layered stack overlaps a second portion of the layered stack, and wherein a maximum potential is defined by the greater of the photon energy and an electronic load across the cathode and anode, and wherein individual breakdown voltages of the dielectric layers are greater than the maximum potential.

2. The photoelectric cell of claim 1, wherein the cathode layer is sufficiently thin such that any heating of the cathode by photon-excited electrons is substantially minimized.

3. The photoelectric cell of claim 2, wherein the cathode layer is a layer of tungsten having a thickness of less than one micron.

4. The photoelectric cell of claim 2, wherein the anode and cathode layers are conductive planar sheets, and wherein the layered stack is wrapped around the light source with the cathode layer being the closest layer to the light source.

5. The photoelectric cell of claim 4, wherein the layered stack is wrapped multiple times around the light source thereby forming a substantially cylindrical roll.

6. The photoelectric cell of claim 5, wherein ends of the wrapped photoelectric cell are crimped.

7. The photoelectric cell of claim 2, wherein the anode and cathode layers comprise conductive matrices, and wherein the layered stack is wrapped around the light source with the cathode layer being the closest layer to the light source.

8. The photoelectric cell of claim 2, wherein the layered stack is folded over on itself.

9. The photoelectric cell of claim 8, wherein the light source is disposed outside the photoelectric cell such that an exterior surface of the photoelectric cell is exposed to photons from the light source.

10. The photoelectric cell of claim 2, wherein thin wire traces are built into the cathode layer so as to reduce the resistance of the cathode layer.

11. The photoelectric cell of claim 2, wherein the dielectric layers are electrically insulating mesh barriers.

12. The photoelectric cell of claim 2, wherein the dielectric layers are empty space.

13. The photoelectric cell of claim 5, wherein the light source is a lossy light pipe extending down the center of the roll.

14. A non-photovoltaic photoelectric cell comprising:
a layered stack wrapped around a photon-producing light source at least twice, wherein the layered stack comprises the following layers bonded together in the following order, starting with the layer closest to the light source:
a cathode layer,
a first, substantially-photon-transparent, dielectric layer,
a substantially-photon-transparent anode, and
a second, substantially-photon-transparent, dielectric layer; and
wherein a maximum potential is defined by the greater of the photon energy and an electronic load across the cathode and anode, and wherein individual breakdown voltages of the dielectric layers are greater than the maximum potential.

15. The photoelectric cell of claim 14, wherein the cathode layer is sufficiently thin such that any heating of the cathode by photon-excited electrons is substantially minimized and such that photon-excited electrons are ejected from top and bottom sides of the cathode layer.

16. The photoelectric cell of claim 15, wherein the light source produces x-rays.

17. The photoelectric cell of claim 15, wherein the light source produces gamma rays.

18. The photoelectric cell of claim 15 wherein the thicknesses of the layers are selected based on the energy of the photons.

19. The photoelectric cell of claim 15, wherein the anode layer is indium tin oxide (ITO).

20. The photoelectric cell of claim 15, wherein the layered stack is wrapped multiple times around the light source thereby forming a substantially cylindrical roll.

* * * * *